(12) United States Patent
Matthews et al.

(10) Patent No.: US 7,856,344 B2
(45) Date of Patent: Dec. 21, 2010

(54) METHOD FOR TRANSFORMING OVERLAPPING PATHS IN A LOGICAL MODEL TO THEIR PHYSICAL EQUIVALENT BASED ON TRANSFORMATION RULES AND LIMITED TRACEABILITY

(75) Inventors: John Matthews, Dublin (IE); Pat Meehan, Meath (IE)

(73) Assignee: International Business Machines Corporation, Armonk, NY (US)

( * ) Notice: Subject to any disclaimer, the term of this patent is extended or adjusted under 35 U.S.C. 154(b) by 433 days.

(21) Appl. No.: 11/962,691

(22) Filed: Dec. 21, 2007

(65) Prior Publication Data

US 2009/0164197 A1 Jun. 25, 2009

(51) Int. Cl.
*G06F 17/50* (2006.01)
*G06F 13/00* (2006.01)

(52) U.S. Cl. .............................. 703/2; 703/14; 716/12; 711/114; 711/115

(58) Field of Classification Search ............ 703/2, 703/14; 711/114, 162, 105, 115; 716/12
See application file for complete search history.

(56) References Cited

U.S. PATENT DOCUMENTS

| | | | | |
|---|---|---|---|---|
| 6,857,053 B2 * | 2/2005 | Bolik et al. | ................ | 711/162 |
| 2005/0182773 A1 * | 8/2005 | Feinsmith | .................. | 707/100 |
| 2006/0112219 A1 * | 5/2006 | Chawla et al. | .............. | 711/114 |
| 2008/0189679 A1 * | 8/2008 | Rodriguez et al. | ......... | 717/105 |
| 2009/0327854 A1 * | 12/2009 | Chhajer et al. | ............. | 715/227 |

OTHER PUBLICATIONS

"Data Modeling"; [Online Reference: http://en.wikipedia.org/wiki/Data_modeling]; Retrieved on Dec. 21, 2007.
"Entity-Relationship Model"; [Online Reference: http://en.wikipedia.org/wk/Entity-relationship_model]; Retrieved on Dec. 21, 2007.

* cited by examiner

*Primary Examiner*—Thai Phan
(74) *Attorney, Agent, or Firm*—Cantor Colburn LLP; Elissa Wang

(57) ABSTRACT

A method for transforming paths in a logical model to their physical equivalent in a physical model is provided. A logical model is retrieved. All entities in the logical model are mapped. All paths connecting the entities of the logical model are mapped. Tables are created that correspond to the entities in the logical model for traceability. Columns are created that correspond to attributes of the paths in the logical model for traceability. A reduced logical model is created by reducing overlapping paths in the logical model. Virtual logic paths are created where an entity is rolled up, is rolled down, or participates in a many-to-many relationship in the reduced logical model. The reduced logical model is transformed into a physical model.

2 Claims, 2 Drawing Sheets

METHOD FOR TRANSFORMING OVERLAPPING PATHS IN A LOGICAL MODEL TO THEIR PHYSICAL EQUIVALENT BASED ON TRANSFORMATION RULES AND LIMITED TRACEABILITY

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND

This invention relates to transforming logical models into physical models, and particularly to addressing issues with overlapping paths in logical models.

In data modeling, a logical model can be transformed (usually via some transformation function within data modeling tools, such as Erwin or Rational Data Architect (RDA)) into a physical model which can differ significantly from the logical one because of various transformation rules. Such a transformation function lends itself to transforming the entire model, packages within the model, or entities.

However, in many cases, only a selection of paths through the logical model is of interest. With that selection, we often need to be able to transform such paths to their physical equivalent (e.g., a physical model). For example, in the case of multi-dimensional modeling in data warehousing, we need to isolate and understand the paths between a measured entity and its dimensional entities, and ultimately we need to transform the measured entity and its dimensional entities to their physical equivalent. Effectively, this results in our interest being confined to a set of paths through the logical model and not the entire logical model.

Even though, the transformation of the entire logical model to a physical model may be accomplished via some tooling, the transformation of a subset of the logical model (paths through it) has to be determined.

Typically, there is only partial traceability provided by the transformation tool (e.g., RDA) from the physical model to the logical model in the interests of keeping the physical model footprint as small as possible. In other words, only some model elements from the physical model trace back to the logical model.

It may be difficult to determine what a selection of paths through the logical model resolves to in the physical model (i.e., post transformation). Once this determination is made, artifacts such as structured query language (SQL) scripts can be generated in terms of the appropriate paths through the physical model. Each path through the logical model may have a number of distinctive characteristics, e.g., it has a starting node (entity), it has an end node (entity), and it has a set of connectors between these nodes (entities). A connector is a relationship between the entities. Any connector may be defined by a set of attributes in each entity that it is connecting. A connector can have intersections with other paths of interest (the same connectors can be included in one or more paths of interest).

Current solutions rely on the user manually navigating through the physical model to determine what the set of paths resolve to. In the case of a large model (e.g., data warehousing or operational data stores), such a solution is not sustainable.

Another possible solution is to reduce the logical model to only those elements that support the specified paths and then transform the reduced logical model. Again, this is a very cumbersome and time-consuming task particularly in the context of a large logical model.

It would be desirable to have techniques for transforming paths in a logical model into their physical equivalent.

SUMMARY

A method for transforming paths in a logical model to their physical equivalent in a physical model is provided in accordance with exemplary embodiments. A logical model is retrieved. All entities in the logical model are mapped. All paths connecting the entities of the logical model are mapped. Tables are created that correspond to the entities in the logical model for traceability. Columns are created that correspond to attributes of the paths in the logical model for traceability. A reduced logical model is created by reducing overlapping paths in the logical model. Virtual logic paths are created where an entity is rolled up, is rolled down, or participates in a many-to-many relationship in the reduced logical model. The reduced logical model is transformed into a physical model.

Additional features and advantages are realized through the techniques of exemplary embodiments. Other embodiments of the invention are described in detail herein and are considered a part of the claimed invention. For a better understanding of exemplary embodiments with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features are apparent from the following detailed description taken in conjunction with the accompanying drawings in which:

The detailed description explains exemplary embodiments, together with advantages and features, by way of example with reference to the drawings.

DETAILED DESCRIPTION OF EXEMPLARY EMBODIMENTS

Figure 1:
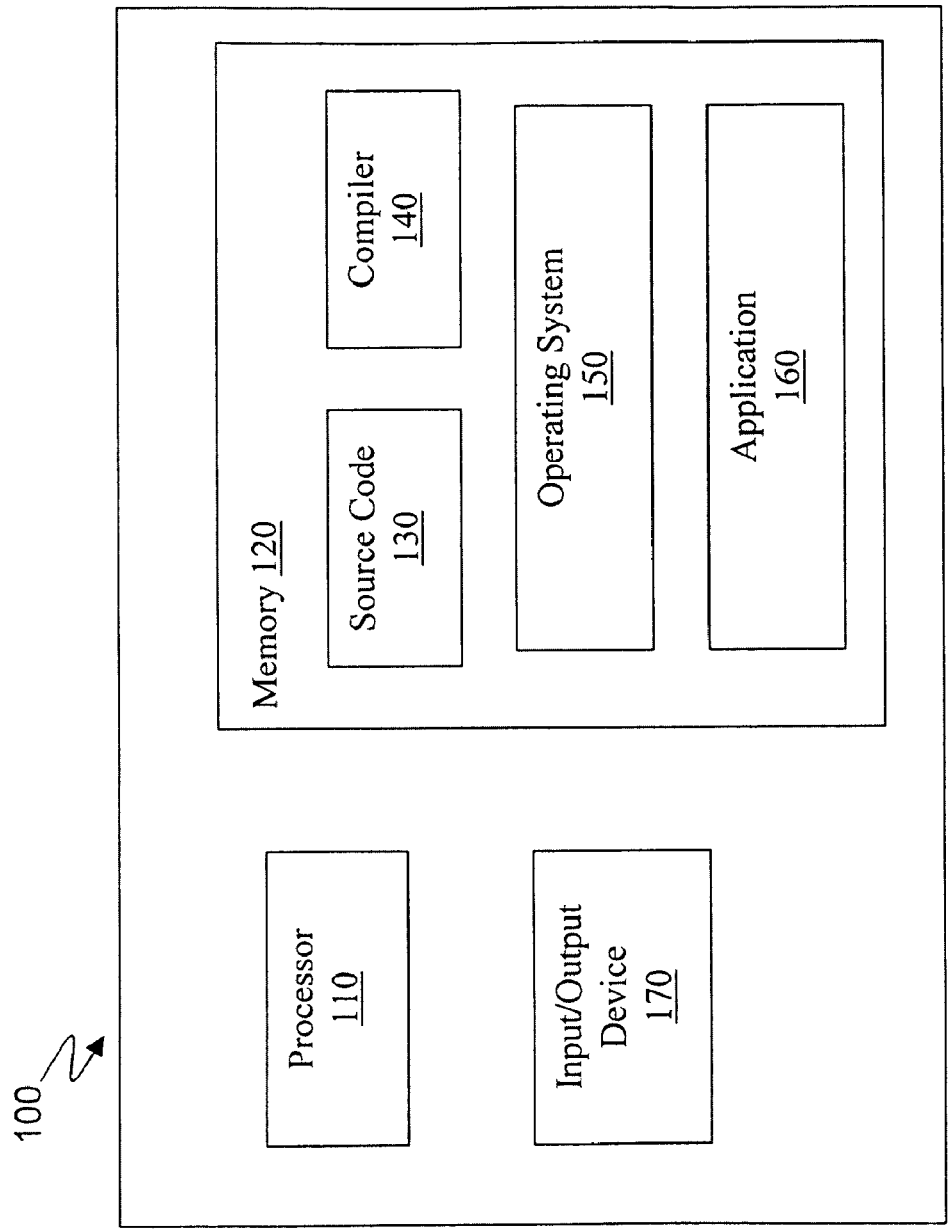
FIG. 1 illustrates an example of a computer having capabilities, which may be included in exemplary embodiments.

FIG. 1 illustrates an example of a computer 100 having capabilities, which may be included in exemplary embodiments. Various methods and techniques discussed herein may also utilize the capabilities of the computer 100.

The computer 100 includes, but is not limited to, PCs, workstations, laptops, PDAs, palm devices, servers, and the like. Generally, in terms of hardware architecture, the computer 100 may include one or more processors 110, memory 120, and one or more input and/or output (I/O) devices 170 that are communicatively coupled via a local interface (not shown). The local interface can be, for example but not limited to, one or more buses or other wired or wireless connections, as is known in the art. The local interface may have additional elements, such as controllers, buffers (caches), drivers, repeaters, and receivers, to enable communications. Further, the local interface may include address, control, and/ or data connections to enable appropriate communications among the aforementioned components.

The processor 110 is a hardware device for executing software that can be stored in the memory 120. The processor 110 can be virtually any custom made or commercially available processor, a central processing unit (CPU), a data signal processor (DSP), or an auxiliary processor among several processors associated with the computer 100, and the processor 110 may be a semiconductor based microprocessor (in the form of a microchip) or a macroprocessor.

The memory 120 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 120 may incorporate electronic, magnetic, optical, and/or other types of storage media. Note that the memory 120 can have a distributed architecture, where various components are situated remote from one another, but can be accessed by the processor 110.

The software in the memory 120 may include one or more separate programs, each of which comprises an ordered listing of executable instructions for implementing logical functions. The software in the memory 120 includes a suitable operating system (O/S) 150, compiler 140, source code 130, and an application 160 (which may be one or more applications) of the exemplary embodiments. As illustrated, the application 160 comprises numerous functional components for implementing the features and operations of the exemplary embodiments. The application 160 of the computer 100 may represent the various applications for implementing exemplary embodiments referred to herein, but the application 160 is not meant to be a limiting.

The operating system 150 controls the execution of other computer programs, and provides scheduling, input-output control, file and data management, memory management, and communication control and related services. It is contemplated by the inventors that the application 160 for implementing exemplary embodiments is applicable on all other commercially available operating systems.

The application 160 may be a source program, executable program (object code), script, or any other entity comprising a set of instructions to be performed. When a source program, then the program is usually translated via a compiler (such as the compiler 140), assembler, interpreter, or the like, which may or may not be included within the memory 120, so as to operate properly in connection with the O/S 150. Furthermore, the application 160 can be written as (a) an object oriented programming language, which has classes of data and methods, or (b) a procedure programming language, which has routines, subroutines, and/or functions, for example but not limited to, C, C++, C#, Pascal, BASIC, API calls, HTML, XHTML, XML, ASP scripts, FORTRAN, COBOL, Perl, Java, ADA, .NET, and the like.

The I/O devices 170 may include input devices such as, for example but not limited to, a mouse, keyboard, scanner, microphone, camera, etc. Furthermore, the I/O devices 170 may also include output devices, for example but not limited to, a printer, display, etc. Finally, the I/O devices 170 may further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 170 also include components for communicating over various networks including the Internet.

If the computer 100 is a PC, workstation, intelligent device or the like, the software in the memory 120 may further include a basic input output system (BIOS) (omitted for simplicity). The BIOS is a set of essential software routines that initialize and test hardware at startup, start the O/S 150, and support the transfer of data among the hardware devices. The BIOS is stored in some type of read-only-memory, such as ROM, PROM, EPROM, EEPROM or the like, so that the BIOS can be executed when the computer 100 is activated.

When the computer 100 is in operation, the processor 110 is configured to execute software stored within the memory 120, to communicate data to and from the memory 120, and to generally control operations of the computer 100 pursuant to the software. The application 160 and the O/S 150 are read, in whole or in part, by the processor 110, perhaps buffered within the processor 110, and then executed.

When the application 160 is implemented in software it should be noted that the application 160 can be stored on virtually any computer readable medium for use by or in connection with any computer related system or method. In the context of this document, a computer readable medium may be an electronic, magnetic, optical, or other physical device or means that can contain or store a computer program for use by or in connection with a computer related system or method.

The application 160 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium.

More specific examples (a nonexhaustive list) of the computer-readable medium would include the following: an electrical connection (electronic) having one or more wires, a portable computer diskette (magnetic or optical), a random access memory (RAM) (electronic), a read-only memory (ROM) (electronic), an erasable programmable read-only memory (EPROM, EEPROM, or Flash memory) (electronic), an optical fiber (optical), and a portable compact disc memory (CDROM, CD R/W) (optical). Note that the computer-readable medium could even be paper or another suitable medium, upon which the program is printed or punched, as the program can be electronically captured, via for instance optical scanning of the paper or other medium, then compiled, interpreted or otherwise processed in a suitable manner if necessary, and then stored in a computer memory.

In exemplary embodiments, where the application 160 is implemented in hardware, the application 160 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

In exemplary embodiments, logical models may be transformed into physical models utilizing the capabilities of a computing device, such as the computer 100. The computer 100 is for explanatory purposes and is not meant to be limiting in any manner.

In accordance with exemplary embodiments, in data modeling, each entity in the path (of a logical model) can have a number of typical transformation rules applied to it. As non-limiting examples, an entity can be transformed into a table; an entity can be rolled up into another (target) entity and that target entity can in turn be the object of any of these transformations; an entity can be rolled down into another (target) entity and that target entity can in turn be the object of any of these transformations; an entity can be specified as non-persistent or persistent in the physical model; and where there is a many-to-many connector between two entities, each of the participating entities can be the object of the above transformations. In addition, a new connector table is can be created.

The determination of the physical equivalent (post transformation) of a path (e.g., in a physical model) can be achieved in accordance with exemplary embodiments. Traditionally, certain (but not all) elements in the physical model have traceability back to the logical model. Traditionally, columns may have traceability back to the logical model, but tables do not have traceability. Any path through the logical model is defined by a set of ordered relationships. Equally, relationships traditionally do not have traceability. In other words, we cannot directly say that a physical relationship has traceability back to a logical relationship in traditional situations. In the physical model, some elements, for example, connectors (i.e., paths) do not have traceability back to the logical model and must be separately determined. For example, in many cases a connector in the physical model can equate to a number of connectors (or paths) in the logical model, and a solution is required to establish that correlation beyond the basic traceability between physical and logical models. Exemplary embodiments make up for these deficits in traceability.

In exemplary embodiments, a technique is to first reduce any given path to a new path that reflects the transformation rules that are being applied at each element of the path. Once that new path has been established then the basic traceability from physical to logical model can be utilized to resolve the path to its physical equivalent. For example, a connector (relationship) between two entities can be described by a set of ordered attributes in each entity. The table(s) that represent (s) the entity can be determined as follows: consider any attribute of the entity and get its column (from basic traceability information); and from the column, get the table that the column belongs to. For each attribute in each entity that participates in any relationship, get its physical columns and hence discover what the physical equivalent of the logical relationship is.

For example, suppose we have path segment (connector/relationship) A-->B. We must determine what are the attributes that make up that segment from both entities (A and B). In other words, we must determine the details of the relationship. For each attribute from each entity, we can determine its physical equivalent (column). Given a column, we can discover what the containing table is. Now, we have a path segment fully understood in terms of the physical model.

As a non-limiting example, if we have as part of a path: Entity A--related to---Entity B---related to---Entity C----rolled up---Entity D---rolled up----Entity E, this will be resolved to the path Entity A--related to---Entity B---related to----Entity E with the appropriate relationships fully defined. Appropriate relationships may relate to any connector between two entities being defined by an ordered set of attributes in each Entity. For example, the "Entity A-related to-Entity B" relationship is defined by {attribute1, attribute2, ...attributeN) from Entity A and {attribute1, attribute2, ...attributeN) from Entity B. The appropriate relationship is A--->B.

The "Entity B---related to---Entity C----rolled up---Entity D---rolled up----Entity E" relationship is defined by {attribute1, attribute2,... attributeM) from EntityB and {attribute1, attribute2, ...attributeM) from Entity E. In this case the appropriate relationship is from B--to-->E (because of roll-up).

Similarly, if we have as part of a path: Entity A--related to---Entity B---related to---Entity C----rolled down to---Entity D, then this will be resolved to the path Entity A--related to---Entity B---related to---Entity D, with the appropriate relationships fully defined.

If we have a path such as Entity A--related to---Entity B---related to---Entity C and Entity C is non persistent, then this will be resolved to the path Entity A--related to---Entity B.

In the non-limiting example cases, the connector ("--related to--") is fully understood in terms of the ordered set of attributes in each Entity which constitutes it.

Once this has been done, we end up in memory (e.g., the memory 120) with a new path, each part being fully described in terms of elements in the logical model. As discussed herein, a path is set of connectors (relationships). A connector/relationship is defined by two ordered sets of attributes, one set from each entity participating in the relationship. In accordance with exemplary embodiments, holding the path in memory means holding a collection of ordered sets of attributes in memory. It is the equivalent of holding key logical model information in memory.

A second traversal of this new path, using the traceability information (e.g., attribute to column and Entity to table) is used to discover the physical equivalent (physical model) of the logical model.

The advantage of this technique is that exemplary embodiments can programmatically determine the physical equivalent of a path through the logical model using a combination of the transformation rules and limited traceability between the models.

Figure 2:
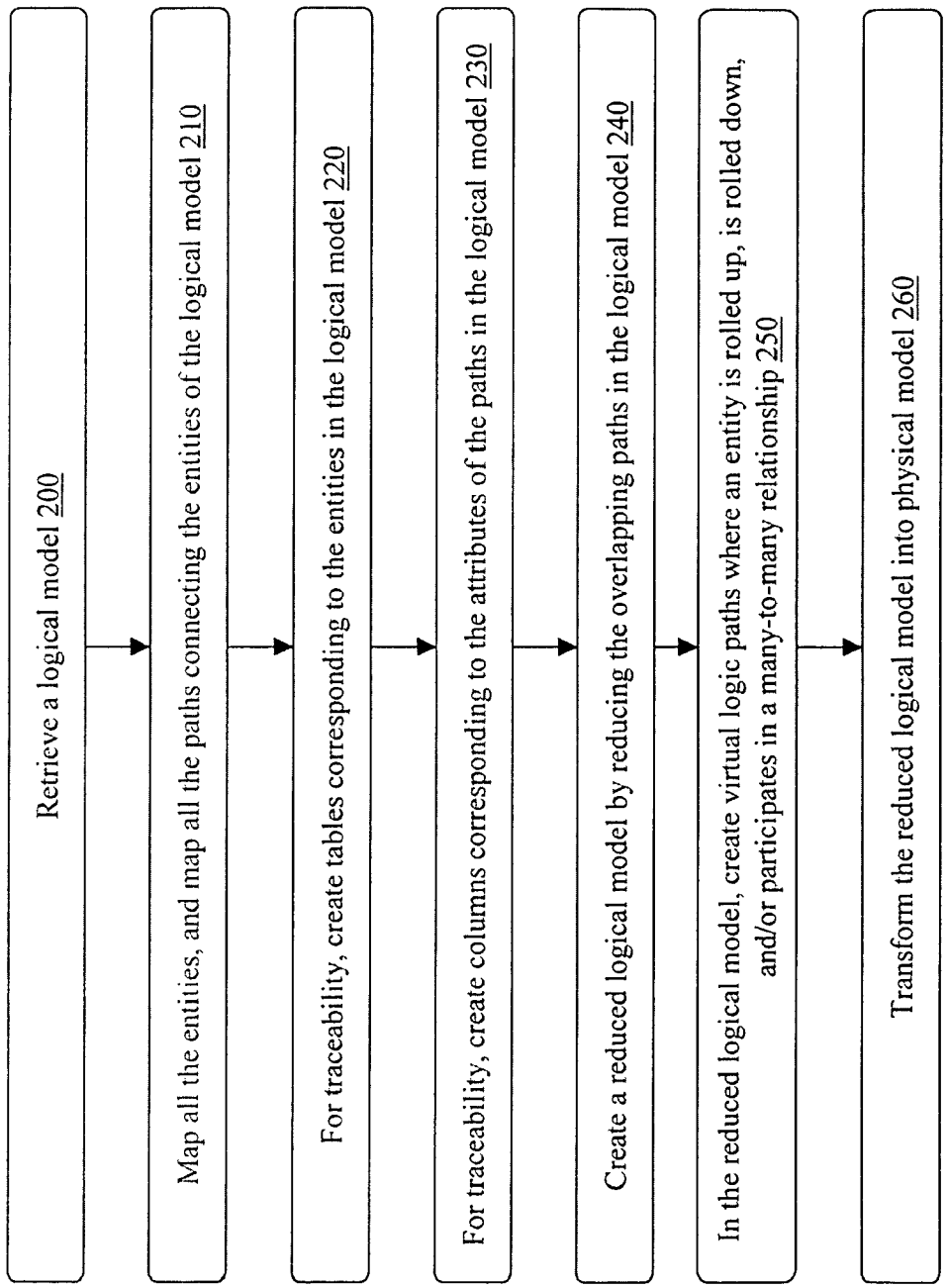
FIG. 2 illustrates a method for transforming paths in a logical model to their physical equivalent in a physical model in accordance with exemplary embodiments.

FIG. 2 illustrates a method for transforming paths in a logical model to their physical equivalent in a physical model, in accordance with exemplary embodiments.

A logical model may be retrieved from, e.g., the memory 120 of the computer 100 at 200. All entities and all paths connecting the entities of the logical modes may be mapped at 210. For traceability, tables are created corresponding to the entities in the logical model at 220. For traceability, columns are created corresponding to the attributes of the paths in the logical model at 230.

A reduced logical model is created by reducing overlapping paths in the logical model at 240. As a non-limiting example, if we have two paths, one path (A-->B-->C-->D) and a second path (X-->Y-->B-->C). These paths are reduced to (A-->B-->C-->D) and (X-->Y). Reduction is achieved by looking for duplicate path segments and eliminating the duplicate path segments so that we end up with a unique set of path segments (a path segment is for example, A-->B).

In the reduced logical model, virtual logic paths may be created where an entity is rolled up, is rolled down, and/or participates in a many-to-many relationship at 250. The reduced logical model is transformed into a physical model at 260. As a non-limiting example of where an entity is rolled up to another entity, we may have A-->B but B is rolled up to C.

Then the virtual logical path is A-->C. As a non-limiting example of where an entity is rolled down to one or more entities, we may have A-->B but B is rolled down to C and D. Then, the virtual logical paths are A-->C and A-->D.

Exemplary embodiments remove the need for any manual effort as discussed herein. Further, exemplary embodiments reduce the set of original paths to a combination of existing path segments and virtual path segments, and hold that in memory. Also, exemplary embodiments process each path segment from memory to get the path segment's physical equivalent using the limited traceability available (e.g., column-->attribute). The provision of sufficient information in the memory is used to create a structured query language (SQL).

Based on a starter set of paths, exemplary embodiments create the necessary equivalent logical model information and can then transform that into the logical information into its physical equivalent. Exemplary embodiments determine what physical tables an entity resolves to as well as what a logical relationship (relationship in the logical model) resolves to in terms. Techniques discussed herein eliminate the need for an actual logical model to be created in order to determine the physical equivalent of a set of paths.

The capabilities of the exemplary embodiment can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While exemplary embodiments have been described, it will be understood that those skilled in the art, both now and in the future, may make various improvements and enhancements which fall within the scope of the claims which follow. These claims should be construed to maintain the proper protection for the invention first described.

What is claimed is:

1. A method for transforming paths in a logical model to their physical equivalent in a physical model, comprising:
   retrieving a logical model;
   mapping all entities in the logical model;
   mapping all paths connecting the entities of the logical model;
   creating tables corresponding to the entities in the logical model for traceability;
   creating columns corresponding to attributes of the paths in the logical model for traceability;
   wherein the tables represent the entities; and
   wherein creating the tables comprises:
      considering the attributes for each of the entities to obtain the columns for each of the entities;
      from the columns, obtaining each of the tables that the columns belong to and
      for each of the attributes in each of the entities that participate in a logical relationship, obtaining a physical column for each of the entities which is a physical equivalent to the logical relationship;
   creating a reduced logical model by reducing overlapping paths in the logical model;
   creating virtual logic paths where an entity is rolled up, is rolled down, and participates in a many-to-many relationship in the reduced logical model; and
   transforming the reduced logical model into a physical model.

2. The method of claim 1, wherein the method for transforming paths in a logical model to their physical equivalent in a physical model is tangibly embodied on a computer readable medium including instructions for causing a computer to execute the method.

\* \* \* \* \*